United States Patent
Okuno

(10) Patent No.: US 9,349,952 B1
(45) Date of Patent: May 24, 2016

(54) METHODS FOR FABRICATING A MEMORY DEVICE WITH AN ENLARGED SPACE BETWEEN NEIGHBORING BOTTOM ELECTRODES

(71) Applicant: Sony Corporation, Tokyo (JP)

(72) Inventor: Jun Okuno, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/562,880

(22) Filed: Dec. 8, 2014

(51) Int. Cl.
*H01L 45/00* (2006.01)

(52) U.S. Cl.
CPC ............ *H01L 45/1293* (2013.01); *H01L 45/08* (2013.01); *H01L 45/1206* (2013.01); *H01L 45/1226* (2013.01); *H01L 45/16* (2013.01)

(58) Field of Classification Search
CPC ............. H01L 2924/1435; H01L 2924/1434; H01L 21/47; H01L 27/1023; H01L 21/0273; H01L 2924/381; H01L 21/28132
See application file for complete search history.

(56) References Cited

U.S. PATENT DOCUMENTS

| | | | | |
|---|---|---|---|---|
| 5,310,622 | A * | 5/1994 | Sardella | G03F 7/091 216/13 |
| 5,607,874 | A * | 3/1997 | Wang | H01L 27/10817 257/E21.648 |
| 6,653,190 | B1 * | 11/2003 | Yang | H01L 27/11568 257/E21.679 |
| 6,771,536 | B2 | 8/2004 | Li et al. | |
| 7,271,063 | B2 * | 9/2007 | Chung-Zen | H01L 27/115 257/E21.17 |
| 7,638,834 | B2 | 12/2009 | Harari | |
| 2003/0203570 | A1 * | 10/2003 | Song | H01L 21/2885 438/254 |
| 2004/0041181 | A1 * | 3/2004 | Morgan | H01L 27/222 257/295 |
| 2004/0092072 | A1 * | 5/2004 | Kim | H01L 23/5222 438/255 |
| 2006/0273456 | A1 | 12/2006 | Sant et al. | |
| 2009/0269924 | A1 * | 10/2009 | Choi | H01L 21/0337 438/669 |
| 2010/0039865 | A1 * | 2/2010 | Kidoh | H01L 21/8221 365/185.23 |
| 2010/0055621 | A1 | 3/2010 | Hatakeyama et al. | |
| 2012/0302066 | A1 | 11/2012 | Iwao | |
| 2013/0139007 | A1 * | 5/2013 | Higo | G06F 11/1666 714/54 |
| 2013/0140516 | A1 | 6/2013 | Lee et al. | |
| 2014/0017889 | A1 | 1/2014 | Lee et al. | |
| 2014/0126265 | A1 | 5/2014 | Lee et al. | |

FOREIGN PATENT DOCUMENTS

| | | |
|---|---|---|
| JP | 2009-099938 | 5/2009 |
| KR | 20100078716 | 7/2010 |
| KR | 20120063390 | 6/2012 |

OTHER PUBLICATIONS

International Search Report for International (PCT) Patent Application No. PCT/JP2015/005552 dated Feb. 15, 2016, 5 pages.

* cited by examiner

*Primary Examiner* — Mohsen Ahmadi
*Assistant Examiner* — Gustavo Ramallo
(74) *Attorney, Agent, or Firm* — Sheridan Ross P.C.

(57) ABSTRACT

Embodiments of the present invention describe a method for fabricating a memory device comprising an enlarged space between neighboring bottom electrodes comprising depositing a poly-silicon layer on a substrate depositing a carbon layer above the poly-silicon layer, patterning a photo-resist layer on the carbon layer, depositing a first spacer layer on the photo-resist layer and performing a modified photolithography process on the photo resist layer after etching back the spacer layer creating sidewalls.

12 Claims, 5 Drawing Sheets

METHODS FOR FABRICATING A MEMORY DEVICE WITH AN ENLARGED SPACE BETWEEN NEIGHBORING BOTTOM ELECTRODES

FIELD

Certain embodiments of the disclosure relate to methods of fabricating a memory device with an enlarged space between neighboring bottom electrodes.

BACKGROUND

Resistive RAMs (ReRAMs) have emerged as leading candidates to displace conventional Flash memories due to their high density, good scalability, low power and high performance. Previous ReRAM designs demonstrating high performance have done so on low density arrays (such as those less than one Gigabit) while those reporting high-density arrays (such as greater than eight Gigabits) were accompanied by relatively low read and write performance.

ReRAM devices are comprised of a memory array containing a plurality of memory cells. According to well-known architecture two cells are formed as isolated cell materials, using a damascene process or the like. The single cell material is shared between two transistors underneath the variable resistance material via the respective drain terminals of the transistors. Each transistor also comprises a gate terminal and a source terminal. When one of the shared cells is being programmed, a thermal disturbance is caused in the neighboring cell due to the close proximity between neighboring gate terminals (bottom electrodes) which may cause an undesired change in stage of the affected cell.

Therefore there is a need in the art for a method of fabricating a memory device with an enlarged space between neighboring bottom electrodes to avoid thermal disturbances among neighboring memory cells.

SUMMARY

Methods of fabricating a memory device with an enlarged space between neighboring bottom electrodes are provided as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Figure 1:
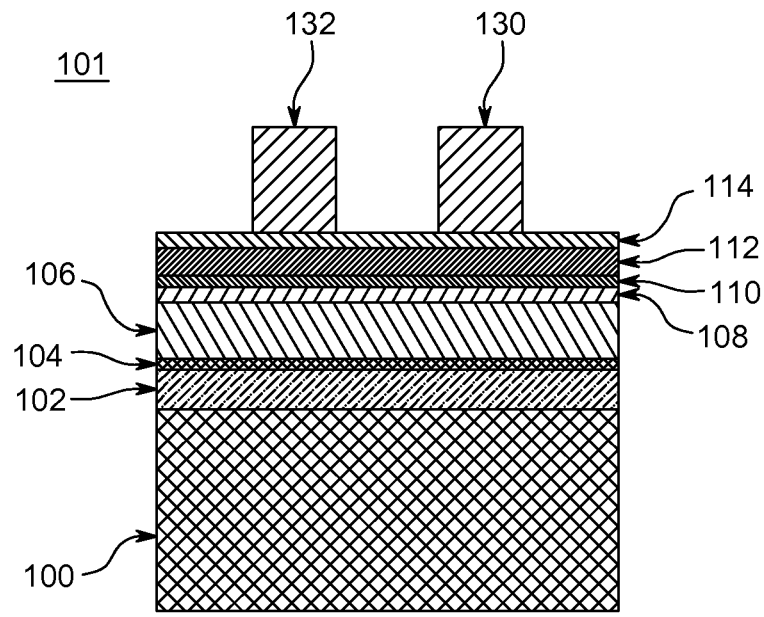
FIG. 1 depicts a first step in fabricating a memory device in accordance with exemplary embodiments of the present invention.

Certain implementations of the invention are directed towards methods for fabricating a memory device with an enlarged space between neighboring bottom electrodes. Embodiments of the methods comprise modifying lithography conditions so that photo-resist structure has a width that is less than the distance between neighboring photo-resist structures using a pitch-tripling process. Other embodiments comprise, after photo-lithography, performing a dry etching process or heating up the photo-resist layer to shrink the layer to establish a different width. In yet another embodiment, a thinner spacer oxide is deposited on carbon structures in order to increase the width between each carbon structure. In the final embodiment, dry etching conditions are modified to create larger FIG. 1 depicts a first step in fabricating a memory device in accordance with exemplary embodiments of the present invention. The structure 101 shown in FIG. 1 is created by depositing a poly-silicon layer 102 on a substrate 100. A sacrificial layer 104 is further deposited on the poly-silicon layer 102. A carbon layer 106 is deposited on the sacrificial layer 104. Layer 108 is an Anti-Reflection Coating layer for photo lithography, while layer 110 is another etch-stop layer. Layer 112 is another carbon layer, while a second sacrificial layer 114 is deposited on the carbon layer 112.

A photoresist is patterned on the sacrificial layer 114, where photoresist structures 130 and 132 are created using photolithography. Those of ordinary skill in the art will recognize that multiple photoresist structures such as 130 and 132 are created during the photolithography patterning process; structures 130 and 132 are only shown in FIG. 1 for brevity.

Figure 2:
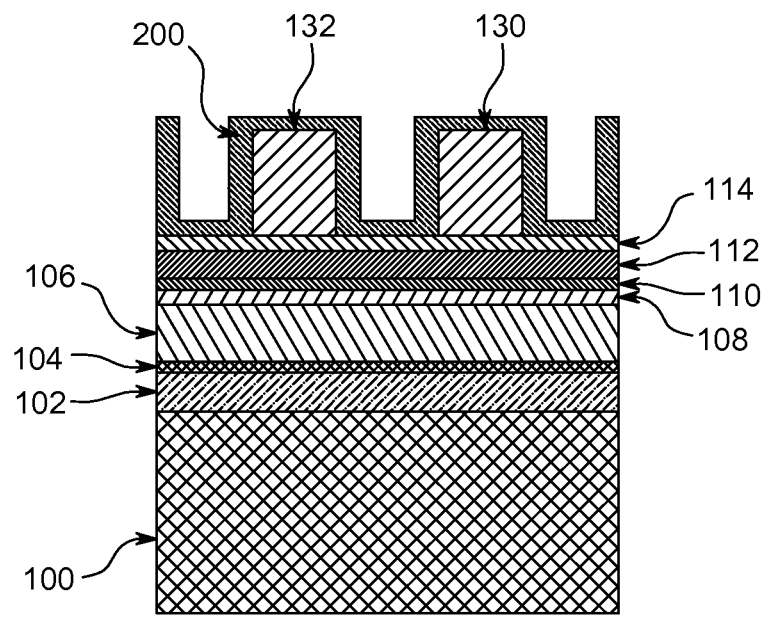
FIG. 2 depicts a second step in fabricating a memory device in accordance with exemplary embodiments of the present invention.

FIG. 2 depicts a second step in fabricating a memory device in accordance with exemplary embodiments of the present invention. A spacer oxide layer 200 is deposited on the photoresist structures 130 and 132.

Figure 3:
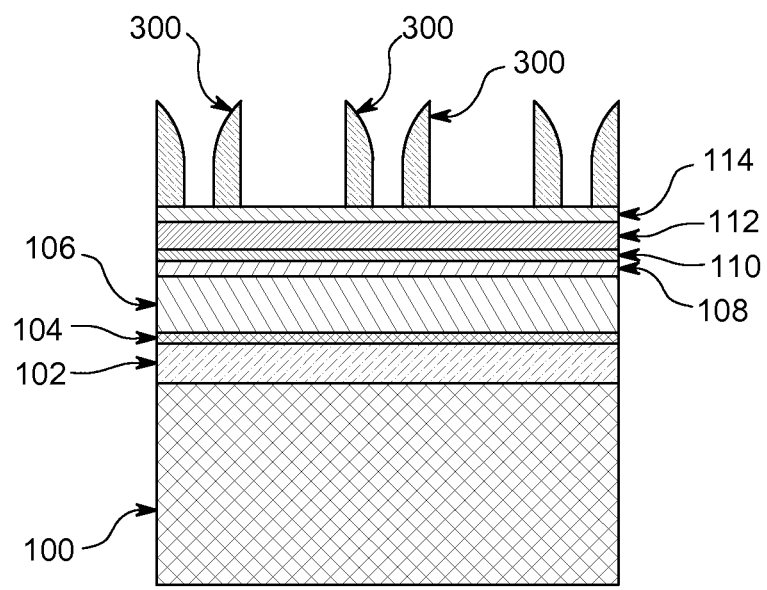
FIG. 3 depicts a third step in fabricating a memory device in accordance with exemplary embodiments of the present invention.

FIG. 3 depicts a third step in fabricating a memory device in accordance with exemplary embodiments of the present invention. The spacer oxide layer 200 is etch-backed while the sidewalls of layer 200 remain. Subsequently, the photoresist structures 130 and 132 are exhumed, leaving oxide sidewalls 300. According to some embodiments, the photoresist structures 130 and 132 are removed via dry-oxide etching, though other methods may be used.

According to exemplary embodiments, the width of the structures 130 and 132 is greater than the width of the gap between neighboring structures 130 and 132. This is achieved by modifying the lithography conditions when removing the photo-resist. In one embodiment, an under-exposure condition at the patterning photo-resist steps can be created to achieve the width differential. In another embodiment, a special reticle is used which has the width differential pattern while using the standard exposure during photo-resist patterning. Those of ordinary skill in the art will recognize other modifications to the lithography conditions which can be performed to modify the width of the structures 130 and 130 to be greater than the width between neighboring structures 130 and 132.

Figure 4:
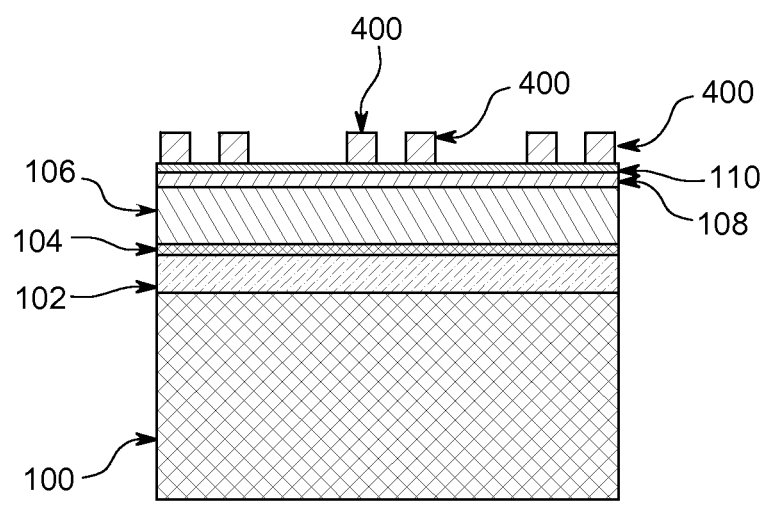
FIG. 4 depicts a fourth step in fabricating a memory device in accordance with exemplary embodiments of the present invention.

In other embodiments, instead of modifying the lithography conditions, the width of the structures 130 and 132 are kept the same as the width between neighboring sidewalls 300. However, after the photo-resist is patterned, the photo-resist is "slimed", i.e., a different width between the neighboring sidewalls 300 and 302 is established by shrinking the photoresist material using a dry etching process or heating the photo-resist material FIG. 4 depicts a fourth step in fabricating a memory device in accordance with exemplary embodiments of the present invention. Using the oxide sidewalls 300 as a mask, the carbon pattern shown in FIG. 4 are created as the oxide sidewalls 300 are etched using wet etching, for example, so as not to etch carbon layer 112, where carbon structures 400 remain.

Figure 5:
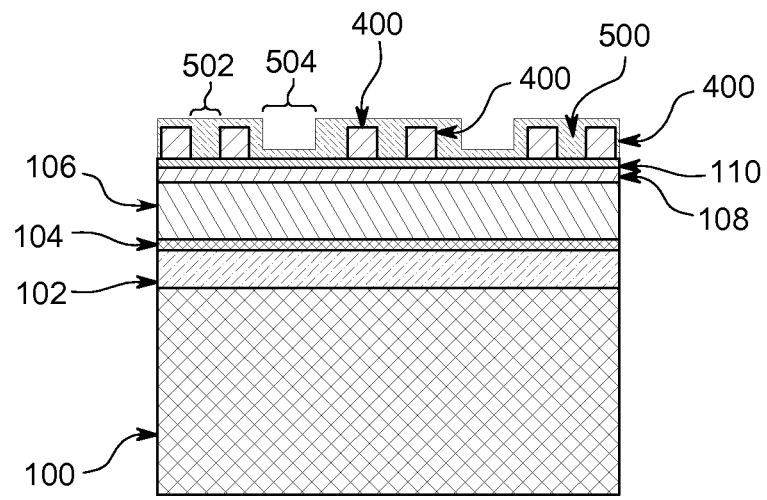
FIG. 5 depicts a fifth step in fabricating a memory device in accordance with exemplary embodiments of the present invention.

FIG. 5 depicts a fifth step in fabricating a memory device in accordance with exemplary embodiments of the present invention. A second oxide layer 500 is deposited on the carbon structures 400 as a spacer oxide layer. According to one embodiment of the present invention, the oxide layer is thinned to increase the distance between each carbon structure 400, resulting in ultimately wider wordlines. For example, the area 504 is wider than the area 502 due to a thinner second oxide layer 500. In some examples, a 30 nm width between neighboring structures is enough to prevent thermal disturb between cells. In one embodiment, the ratio of the width of the structure 132 and 132 to the space between structures 130 and 132 is 1.2.

Figure 6:
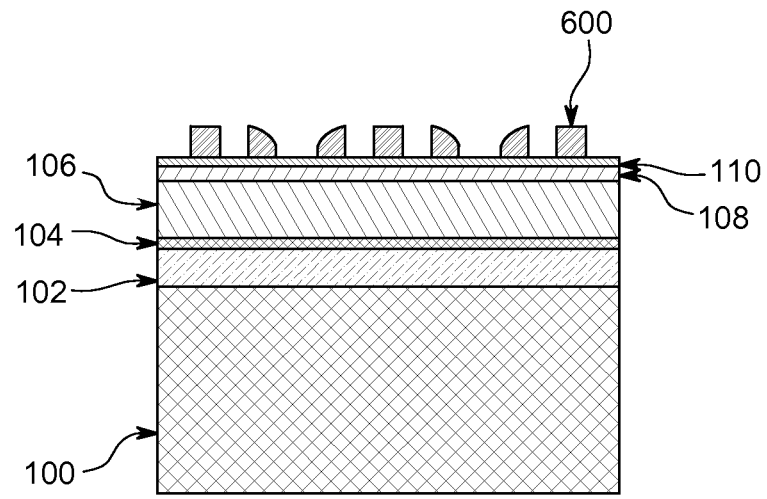
FIG. 6 depicts a sixth step in fabricating a memory device in accordance with exemplary embodiments of the present invention.

FIG. 6 depicts a sixth step in fabricating a memory device in accordance with exemplary embodiments of the present invention. The second oxide layer 500 is etched back, while the carbon structures 400 are exhumed leaving the oxide sidewall structures 600. Due to the shape of the oxide sidewall structures 600, the eventual trench regions formed will be deeper in some areas as compared to neighboring trench regions as shown in FIGS. 7-10 as an example.

Figure 7:
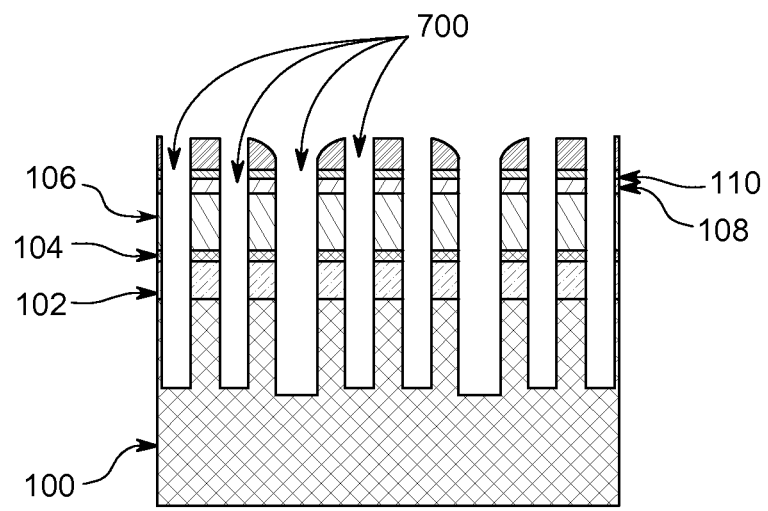
FIG. 7 depicts a seventh step in fabricating a memory device in accordance with exemplary embodiments of the present invention.

FIG. 7 depicts a seventh step in fabricating a memory device in accordance with exemplary embodiments of the present invention. Trenches 700 are formed by a proprietary dry etching process removing portions of layers 100, 102, 104 106, 108, and 110 based on a predetermined etching time.

In some embodiments, the dry etching process can be modified to increase the line width instead of employing the earlier mentioned methods of modifying the lithography conditions, or the thickness of the second oxide layer 500. For example, the etching rate or etching gas may be changed in order to reduce the thickness. The thickness of the oxide layer 500 is gradually reduced during the preceding etching steps affecting the width of the space between the structures, where wordlines will be placed.

Figure 8:
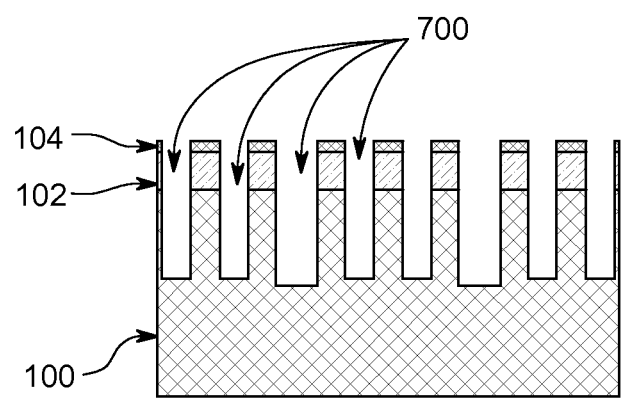
FIG. 8 depicts an eighth step in fabricating a memory device in accordance with exemplary embodiments of the present invention.

FIG. 8 depicts an eighth step in fabricating a memory device in accordance with exemplary embodiments of the present invention.

A RAD strip is performed to remove layers 106, 108 and 110 entirely, leaving the sacrificial layer 104 and the poly-silicon layer 102 on the substrate 100.

Figure 9:
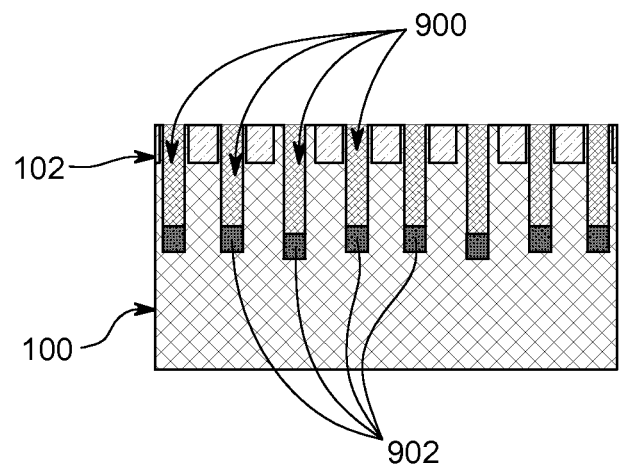
FIG. 9 depicts a ninth step in fabricating a memory device in accordance with exemplary embodiments of the present invention.

FIG. 9 depicts a ninth step in fabricating a memory device in accordance with exemplary embodiments of the present invention. The gate electrode 902 is deposited in each of the trenches 700 by depositing, in one embodiment, W or TiNi. An oxide layer 900 is deposited in each of the trenches 700 on the gate electrodes 902.

Figure 10:
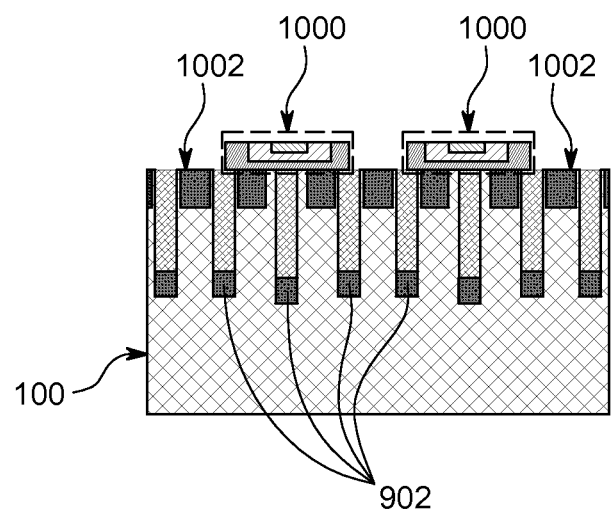
FIG. 10 depicts a tenth step in fabricating a memory device in accordance with exemplary embodiments of the present invention.

FIG. 10 depicts a tenth step in fabricating a memory device in accordance with exemplary embodiments of the present invention.

The poly-silicon layer 102 is removed via a dry-etching process by a condition which has selectivity with SiO2 and SiN. Top electrodes 1002 are implanted to act as drain and source for the memory device via ion implantation of Phosphorus. Active cell material 1000 is deposited on top of each implanted top electrodes 1002.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for fabricating a memory device comprising an enlarged space between neighboring bottom electrodes comprising:
    depositing a poly-silicon layer on a substrate;
    depositing a carbon layer above the poly-silicon layer;
    patterning a photo-resist layer on the carbon layer,
    depositing a first spacer layer on the photo-resist layer;
    performing a modified photolithography process on the photo resist layer after etching back the first spacer layer creating sidewalls;
    etching the sidewalls by using the sidewalls as a mask to create a photo-resist pattern;
    depositing a second spacer layer on the carbon layer;
    etching back the second spacer layer;
    exhuming the carbon layer leaving pairs of carbon sidewalls;
    performing an etching process to form trenches;
    stripping all layers except the poly-silicon layer and the substrate, forming stacks topped with poly-silicon;
    implanting a bottom electrode in each of the trenches; and
    implanting a top electrode in each of the stacks.

2. The method of claim 1 further comprising:
    depositing an oxide layer above the bottom electrodes; and
    depositing active cell material on the oxide layer and neighboring top electrodes.

3. The method of claim 2, further comprising:
    removing the poly-silicon prior to implanting the top electrodes.

4. The method of claim 1, wherein instead of modifying lithography conditions, the second spacer layer is thinned so when the second spacer layer is etched, a distance between a sidewall in neighboring carbon sidewalls is greater than a distance between each sidewall in a pair of carbon sidewalls to achieve a greater wordline width.

5. The method of claim 1, wherein the first spacer layer and the second spacer layer are oxide layers.

6. The method of claim 1, wherein the photo-resist is slimed after being patterned.

7. The method of claim 1, wherein the photo-resist pattern is modified to overexpose the photo resist layer.

8. A method for fabricating a memory device comprising an enlarged space between neighboring bottom electrodes comprising:

depositing a poly-silicon layer on a substrate,
depositing a carbon layer above the poly-silicon layer;
patterning a photo-resist layer on the carbon layer, wherein after the photo-resist layer is patterned, the photo-resist layer is shrunk to achieve a greater wordline width; and
depositing a first spacer layer on the photo-resist layer.

9. The method of claim 8, wherein shrinking is performed using a dry etching process.

10. The method of claim 9, wherein shrinking is performed using a heating process.

11. A memory device comprising:
a plurality of memory cells coupled to a plurality of wordlines,
wherein a bottom electrode of a transistor coupled to each of the plurality of memory cells is spaced a predetermined distance away from a bottom electrode of a transistor coupled to a neighboring memory cell to prevent thermal disturbances.

12. The memory device of claim 11, wherein a ratio of the width of the bottom electrode to the width of the distance between neighboring electrodes is 1.2 or greater.

* * * * *